United States Patent
Winterer et al.

(10) Patent No.: US 6,313,729 B1
(45) Date of Patent: *Nov. 6, 2001

(54) SEMICONDUCTOR DEVICE

(75) Inventors: Jürgen Winterer, Nürnberg; Gottfried Beer, Nittendorf, both of (DE)

(73) Assignee: Siemens Aktiengesellschaft, Munich (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/180,128

(22) PCT Filed: Jun. 20, 1997

(86) PCT No.: PCT/DE97/01279

§ 371 Date: Nov. 2, 1998

§ 102(e) Date: Nov. 2, 1998

(87) PCT Pub. No.: WO98/00691

PCT Pub. Date: Jan. 8, 1998

(30) Foreign Application Priority Data

Jun. 28, 1996 (DE) .............................. 196 26 081

(51) Int. Cl.⁷ .................................................. H01L 10/10
(52) U.S. Cl. .............................. 338/36; 338/42; 257/419; 257/417; 73/715
(58) Field of Search .................. 338/4, 36, 41, 338/42; 73/715, 721, 727; 257/417, 419

(56) References Cited

U.S. PATENT DOCUMENTS

| | | | |
|---|---|---|---|
| 3,764,950 | * 10/1973 | Wallia | 338/2 |
| 4,500,864 | * 2/1985 | Nakane et al. | 338/4 |
| 4,656,454 | * 4/1987 | Rosenberger | 338/2 |
| 4,670,730 | * 6/1987 | Takeda et al. | 338/4 |
| 5,031,462 | * 7/1991 | Lam | 73/756 |
| 5,184,107 | * 2/1993 | Maurer | 338/42 |
| 5,461,922 | * 10/1995 | Koen | 73/756 |
| 5,581,023 | * 12/1996 | Handfield et al. | 73/715 |
| 5,581,226 | * 12/1996 | Shah | 338/42 |
| 5,874,679 | * 2/1999 | Sokn | 73/715 |
| 5,948,991 | * 9/1999 | Nomura et al. | 73/727 |

FOREIGN PATENT DOCUMENTS

| | | |
|---|---|---|
| 44 00 439 | 7/1994 | (DE) . |
| 0 202 786 | 11/1986 | (EP) . |
| 0 497 534 | 8/1992 | (EP) . |

OTHER PUBLICATIONS

Patent Abstracts of Japan—Publication No. JP7113706—May 2, 1995.

Patent Abstracts of Japan—Publication No. JP4125438—Sep. 17, 1990.

* cited by examiner

*Primary Examiner*—Karl D. Easthom
(74) *Attorney, Agent, or Firm*—Schiff Hardin & Waite

(57) ABSTRACT

A semiconductor component is fashioned of a chip carrier comprising an approximately planar chip carrier surface on which chip carrier surface a semiconductor chip with a pressure sensor is secured, and composed of electrode terminals penetrating the chip carrier and electrically connected to the semiconductor chip, with a surface-mounted arrangement. The chip overlapping the chip carrier.

5 Claims, 1 Drawing Sheet

SEMICONDUCTOR DEVICE

BACKGROUND OF THE INVENTION

The invention is directed to a semiconductor component formed of a chip carrier having a chip carrier surface on which a semiconductor chip is provided and wherein a pressure sensor is provided above the semiconductor chip.

Such a semiconductor component in the form of a pressure sensor has been disclosed in JP-A-7113706. This has a protective cap provided with an opening that is firmly glued to the chip carrier. A positive connection between chip carrier and protective cap insures a temporary arresting of the protective cap until the adhesive has set.

Another semiconductor pressure sensor with a fitting durably connected to the chip carrier has been disclosed in EP-A-0 497 534. After a snap-in connection, the fitting and the chip carrier exert an adequately high pressure on two elastomeric seals and the chip situated therebetween in order to assure a pressure-tight connection of the two component parts.

For measuring pressures, the medium to be measured must be brought to the sensor or, the pressure prevailing in the medium must be transmitted to the sensor. For this purpose, the pressure sensor is arranged in a component housing open at one side, so that the sensitive chip surface of the pressure sensor can proceed into direct contact with the medium to be measured. There is the disadvantage given this arrangement that the chemicals being employed during the assembly process of the semiconductor component open at one side can proceed to the sensitive chip surface of the pressure sensor, this resulting in the risk of corrosion at the component being accelerated or the component being completely destroyed. Processes upon utilization of chemicals that can result in a contamination of the component with aggressive ions, for example what are referred to as deflash processes or voltaic processes immediately after the fastening of the pressure sensor chip on the chip carrier are thereby especially critical. In a deflash process, the casting compound residues or, burrs that have remained after the plastic casting of the chip carrier are usually removed given employment of a high-pressure water jet. In the voltaic process to be implemented thereafter, the electrode terminals projecting from the housing are provided with a solderable cover coat by lead plating in order to enable a good fastening of the semiconductor component on the equipping surface of a printed circuit board.

SUMMARY OF THE INVENTION

The invention is based on the object of making available a semiconductor component with a semiconductor pressure sensor comprising a sensitive chip surface, particularly for mounting on the equipping surface of a printed circuit board, whereby the semiconductor component preferably comprises a housing open at one side with a chip carrier, said semiconductor component being designed such that a destruction of the sensitive chip surface of the pressure sensor can be avoided in processes wherein harmful chemicals are utilized.

This object is achieved by a semiconductor component comprising a chip carrier having an approximately planar chip carrier surface on which a semiconductor chip is provided. A pressure sensor is also secured above the semiconductor chip. Electrical terminals penetrate the chip carrier and electrically connect to the semiconductor chip. The protective cap overlaps the chip carrier as said pressure sensor. The protective cap comprises a retainer portion for a positive mechanical connection to a supporting structure of the chip carrier such that when the protective cap is put in place onto the chip carrier the retainer portion and the supporting structure proceed into engagement with one another. The protective cap is removable from the chip carrier. The chip carrier has a lower part on which the semiconductor chip is supported and also has lateral parts arranged at sides of the lower part that form laterally terminating housing walls of a housing for the pressure sensor, the supporting structure for the chip carrier being provided on upper edge regions of the walls, and the outside circumference of the walls having a circumferential abutment surface for supporting the retainer portion of the protective cap.

The invention proposes that the chip carrier open at one side be closed with a protective cap during the implementation of the critical assembly processes. The protective cap can also be simultaneously employed as transport protection, whereby a removal of the protective cap only occurs after the mounting of the semiconductor component or before the use of the component as a pressure sensor.

It is provided in the preferred embodiment of the invention that the protective cap is designed removable. The protective cap thereby comprises a retainer portion for a positive mechanical connection to a supporting structure of the chip carrier such that, when the protective cap is put in place on the chip carrier, the retainer portion and the structure unit engage with one another in alternating fashion. In conformity with the principle of the invention, the chip carrier is designed such that the outside circumference of the supporting structure of the chip carrier has a circumferential abutment surface that supports the retainer portion of the protective cap.

For the purpose of a an automatically implemented fixing of chip carrier and protective cap, it can thereby also be provided that the retainer portion of the protective cap is provided with a resilient projection that is allocated with a catch provided in the supporting structure of the chip carrier for the automatic fixing of the protective cap and the chip carrier in a mounting position.

The protective cap is preferably fabricated as an independently designed component part, particularly of plastic material, and can be repeatedly employed for covering the pressure sensor.

It can be provided in another advantageous embodiment of the invention that the chip carrier and the protective cap is produced of a plastic material that is resistant to the chemicals utilized in the assembly of the component.

It can be provided in another preferred embodiment that the protective cap—after the semiconductor component is put in use—is replaced by a fitting for the variable coupling of a feeder containing the medium to be measured. One thus succeeds in making a flexible mounting design available with which basically arbitrary forms of hose or plug connections can be offered for the connection to the pressure sensor, a broad spectrum of customer wishes being thus capable of being satisfied. A delivery of the medium to be measured to the sensor or, a transmission of the pressure prevailing in the medium to the sensor can be assured with a plug coupling—which is simple and cost-beneficial to manufacture—of the fitting replacing the protective cap. Thus the inclusion of outside air is precluded by the positive, play-free mechanical connection between the medium to be measured and the sensor and, therefore, an error-free pressure measurement can be implemented.

In an especially preferred way, the invention is directed to a semiconductor component for a surface mounting on the equipping surface of a printed circuit board. Given this type of mounting, the component terminals are no longer plugged into holes of the printed circuit board, as in plug-in mounting, but are put in place on terminal pads on the printed circuit board and soldered thereto. Components for surface mounting can be smaller than for plug-in mounting since hole and solder lug diameters of the printed circuit board no longer determine the grid dimension of the terminals. The holes needed only for equipping are also eliminated from the printed circuit board, whereby the holes now required only for through-contacting can be implemented as small as technologically possible. Since a double-sided equipping of the printed circuit board is also additionally possible, a considerable space-saving and substantial cost reduction can be achieved by the surface mounting. An especially slight structural height of the semiconductor component thereby derives when the electrode terminals penetrating the chip carrier and electrically connected to the semiconductor chip are fashioned in the form of terminal legs conducted out toward at least two sides of the chip carrier that are bent and cut to form short, rocker-shaped terminal stubs.

Further features, advantages and expediencies of the invention derive from the description of an exemplary embodiment with reference to the drawing.

DESCRIPTION OF THE PREFERRED EMBODIMENTS

Figure 1:
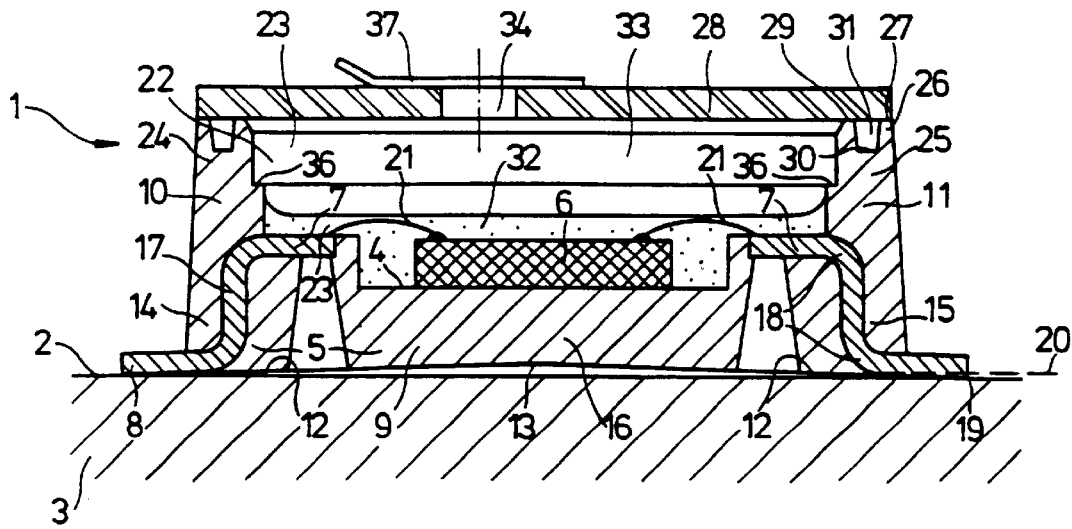
FIG. 1 is a schematic sectional view of a semiconductor component according to an exemplary embodiment of the invention.
Figure 2:
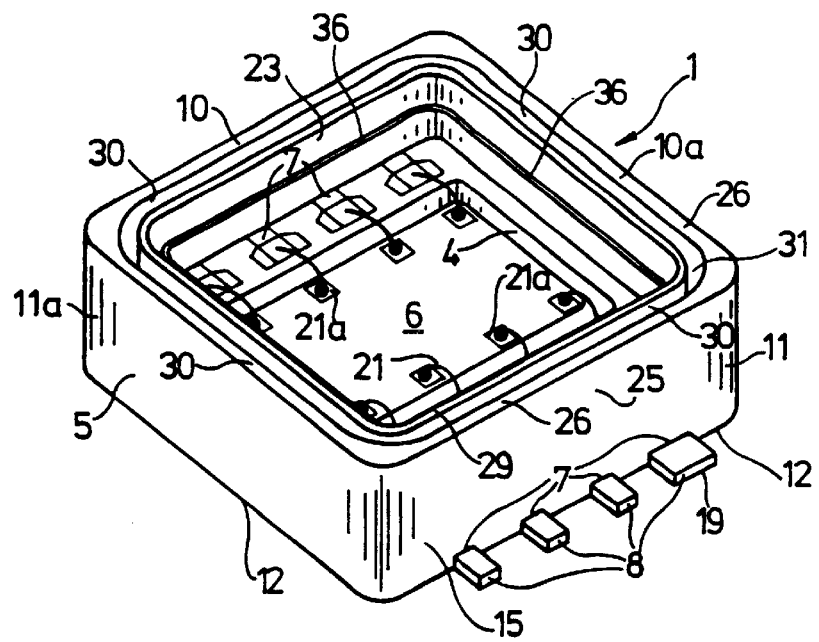
FIG. 2 is a schematic overall view of the chip carrier of a semiconductor component according to the exemplary embodiment.

The Figures show an exemplary embodiment of a semiconductor component 1 for surface mounting on the equipping surface 2 of a printed circuit board 3. The semiconductor component 1 has a chip carrier 5 of electrically insulating plastic material comprising an approximately planar chip carrier surface 4 on which a semiconductor chip 6 with a pressure sensor designed in integrated fashion and an electronic circuit allocated thereto is secured—whereby the pressure sensor and the circuit are not shown in greater detail in the Figures—, and has electrode terminals 7 penetrating the chip carrier 5 and electrically connected to the semiconductor chip 6 whose ends 8 (not shown in greater detail) are put in place on terminal pads of the equipping surface 2 of the printed circuit board 3 and are soldered thereat. The chip carrier 5, which, in particular, is manufactured of one piece with a known plastic casting process, comprises a lower part 9 raised relative to the equipping surface 2 on which the semiconductor chip 6 is supported, and also comprises lateral parts 10, 10a and 11, 11a arranged at the sides of the lower part 9 that form the laterally terminating housing walls of the pressure sensor housing. The chip carrier 5 is designed such in the way shown essentially to scale in FIG. 1 such that the outer limiting surfaces 12, 13 of the chip carrier 5 facing toward the equipping surface 2 of the printed circuit board 3 exhibit a spacing from the equipping surface 2 of the printed circuit board 3 that increases steadily from the lower edge regions 14, 15 toward the middle region 16 of the chip carrier 5. In particular, the outer limiting surfaces 12, 13 of the chip carrier 5—as viewed in crossection—comprise an essentially inverted V-shaped path or, respectively, a path designed in roof-shaped fashion such that the point of the inverted V is centrally arranged, whereby the greatest distance at this location from the printed circuit board has a value of approximately 0.1 mm through approximately 0.5 mm. It is also provided that the electrode terminals 7 that penetrate the chip carrier 5 and are electrically connected to the semiconductor chip 6 are designed in the form of terminal legs conducted out toward at least two sides of the chip carrier 5 that are bent and are cut to form short rocker-shaped terminal stubs 17. Such an arrangement assures a minimum structural height of the sensor component. Further, the bends 18 of the terminal legs are completely accepted within the lateral parts 10, 11 of the chip carrier 5, which has the advantage that the housing is again reduced in terms of its dimensions, the size of the leadframe is diminished and, moreover, the creep paths are considerably lengthened for corrosive agents and, thus, a permeation with chemicals is reduced. Over and above this, such an arrangement enables a mechanical anchoring of the leadframe or, respectively, of the electrode terminals 7 within the housing of the component and, thus, an additional increase of the mechanical stability overall. Further, the ends 8 of the terminal legs projecting from the lateral parts 10, 11 of the chip carrier 5 have a slight slant relative to the equipping surface 2 of the printed circuit board 3 such that the outermost edge 19 of the end 8 of the terminal legs facing toward the equipping surface 2 has a spacing of approximately 0.1 mm from the auxiliary plane 20 shown dot-dashed. This arrangement assures that a contact of the component to the equipping surface 2 of the printed circuit board 3 is only established by the outermost ends 8 of the terminal legs, which, together with the illustrated, beneficial housing arrangement wherein the lower part is designed lifted from the printed circuit board and the housing is designed in roof form, as shown, does justice to possible sags of the printed circuit board 3. Beyond this, problems are avoided in the equipping of the component on the printed circuit board 3 as well as during later use of the printed circuit board 3. Advantageously, a setting with what are referred to as trimming and shaping tools that were hitherto required in the equipping can thereby be eliminated, and the prescribed demands made of the floor spacing to be adhered to are simultaneously taken into consideration. The equipping can be more beneficially implemented since a good adhesion of the equipping glue is assured, and, beyond this, possible tolerances of the printed circuit board 3 in view of sags are compensated, and stresses of a thermal and/or mechanical nature are opposed since contact to the printed circuit board 3 is only established with the terminal legs.

As shown, a wire contacting process can be utilized for the electrical connection of the pressure sensor designed integrated on the semiconductor chip 6 or the electronic circuit allocated thereto with the electrode terminals 7, whereby bond wires 21 are secured to metallic chip terminal locations 21a on the chip and are drawn to the electrode leg to be correspondingly connected. Beyond this, what is referred to as a spider contacting can be employed instead of bond wires, whereby an electrically conductive system carrier board or what is referred to as a leadframe is utilized instead of bond wires.

The pressure sensor integrated on the semiconductor chip 6 of silicon represents what is referred to as a piezo-resistive sensor, whereby a thin silicon membrane fabricated according to methods of micromechanics is provided in the surface of the chip 6, this being electrically coupled to pressure-dependent resistors that are likewise fashioned in the silicon substrate and connected in a bridge circuit in a known way. A circuit allocated to the sensor that serves for signal editing (amplification and correction) but also for a balancing and compensation of the sensor is likewise integrated in the semiconductor chip 6. Compared to other structures, such semiconductor pressure sensors on which the invention is based are suitable mainly for applications wherein a smallest structural size is important, i.e., for example, given pressure measurements in the motor vehicle field, for example in the measurement of brake pressures, tire pressures, combustion chamber pressures and the like. In addition to semiconductor pressure sensors that work according to the principle of piezo-resistive pressure measurement, those that work according to capacitative measuring principles can also be employed, beyond this.

Given the exemplary embodiment shown in FIG. 1, the chip carrier 5 is designed open at one side at its side 22 facing away from the equipping surface 2 of the printed circuit board 3 and has a supporting structure 26 at the upper edge regions 24, 24 limiting the opening 23 for a positive, play-free mechanical connection to a retainer portion 27 of a protective cap 28 placeable such onto the chip carrier 5 such that the retainer portion 27 and the supporting structure 26 proceed into engagement in alternating fashion when the protective cap 28 is placed onto the chip carrier 5. For this purpose, the outside circumference of the supporting structure 26 of the chip carrier 5 has a circumferential abutment surface 29 that supports the retainer portion 27 of the protective cap 28. As shown, this can be designed in the form of a channel 30 circumferentially formed at the edge region of the chip carrier 5 into which a tongue 31 formed at the outside circumference of the protective cap 28 at least partially engages.

The protective cap 28 has an opening 34 that can be temporarily closed with an adhesive film 37.

The chip carrier 5 is filled with a flowable filler 32 completely covering the semiconductor chip 6 that, in particular, represents a gel that transmits pressures nearly delay-free as well as error-free onto the semiconductor pressure sensor. The gel serves, first, for protecting the sensitive pressure sensor chip 6 and the other, particularly metallic component parts of the semiconductor component, particularly the bond wires 21, the terminal legs 7 or the leadframe against contact with the medium 33 to be measured and to thus prevent a contamination of the component by ions or other harmful constituents of the medium 33 or the risk of corrosion due to the medium 33.

The sidewalls 24, 25 of the chip carrier 5 open at one side are, further, equipped with a flow stop edge 36 arranged continuously at the inside, whereby the inside of the chip carrier 5 is filled with the gel 32 only up to the height of the flow stop edge 36. This flow stop edge 36 enables a defined stop of the capillary forces of the adhesive gel 32 and thus prevents an undesired rise of the gel 32 beyond the housing edges due to capillary forces.

Although various minor changes and modifications might be proposed by those skilled in the art, it will be understood that our wish is to include within the claims of the patent warranted hereon all such changes and modifications as reasonably come within our contribution to the art.

| List of Reference Characters | |
|---|---|
| 1 | semiconductor component |
| 2 | equipping surface |
| 3 | printed circuit board |
| 4 | chip carrier surface |
| 5 | chip carrier |
| 6 | semiconductor chip |
| 7 | electrode terminals |
| 8 | ends |
| 9 | lower part |
| 10,10a,11,11a | lateral parts |
| 12, 13 | outer limiting surfaces |
| 14, 15 | lower edge regions |
| 16 | middle region |
| 17 | terminal stubs |
| 18 | bends |
| 19 | outermost edge |
| 20 | auxiliary plane |
| 21 | bond wires |
| 21a | chip terminal locations |
| 22 | averted side |
| 23 | opening |
| 24,25 | upper edge regions |
| 26 | supporting means |
| 27 | retainer means |
| 28 | protective cap |
| 29 | abutment surface |
| 30 | channel |
| 31 | spring |
| 32 | filler |
| 33 | medium |
| 34 | opening |
| 35 | membrane |
| 36 | flow stop edge |
| 37 | adhesive film |

What is claimed is:
1. A semiconductor component, comprising:
a pressure sensing semiconductor chip;
a chip carrier having a chip carrier surface on which the semiconductor chip is secured;
electrode terminals penetrating the chip carrier and electrically connected to the semiconductor chip;
a protective cap over the chip carrier;
said protective cap comprising a retainer portion formed as an annular tongue for connection to a supporting structure of the chip carrier such that when the protective cap is put in place onto the chip carrier the retainer portion and the supporting structure proceed into engagement with one another;
the protective cap being designed to protect the semiconductor chip during assembly and prior to installation and use, and being removable from the chip carrier such that the semiconductor chip after installation can sense pressure from the side of the semiconductor chip from which the cap is removed; and
the chip carrier comprising a lower part on which the semiconductor chip is supported and also comprising lateral parts arranged at sides of the lower part that form laterally terminating housing walls of a housing for the pressure sensing semiconductor chip, the supporting structure for the chip carrier being provided on upper edge regions of said walls and an outside circumference of the walls having a circumferential upwardly facing top abutment surface having an annular channel extending downwardly therein from said top abutment surface for receiving the retainer portion tongue of the protective cap.
2. The component of claim 1 wherein the protective cap has an opening closed with a self-adhesive film.

3. The component according to claim 1 wherein the protective cap is fabricated as an independently designed component part.

4. The component according to claim 1 wherein the tongue is resilient.

5. The component according to claim 1 wherein the chip carrier and protective cap are manufactured of a plastic material that is resistant to chemicals utilized in assembly of the semiconductor component.

* * * * *